United States Patent

Tsay et al.

[11] Patent Number: 6,140,949
[45] Date of Patent: Oct. 31, 2000

[54] TRIMMING ALGORITHM FOR PIPELINE A/D CONVERTER USING INTEGRATED NON-LINEARITY MEASUREMENT

[75] Inventors: Ching-yuh Tsay; Eric G. Soenen, both of Plano, Tex.

[73] Assignee: Texas Instruments Incorporated, Dallas, Tex.

[21] Appl. No.: 09/190,474

[22] Filed: Nov. 12, 1998

Related U.S. Application Data

[60] Provisional application No. 60/067,236, Dec. 2, 1997.

[51] Int. Cl.[7] .............................. H03M 1/10; H03M 1/06
[52] U.S. Cl. ............................................. 341/120; 341/118
[58] Field of Search ...................................... 341/120, 118, 341/144, 159, 161, 172, 150, 155

[56] References Cited

U.S. PATENT DOCUMENTS

| 5,635,937 | 6/1997 | Lim et al. | 341/161 |
| 5,712,633 | 1/1998 | Bae | 341/120 |
| 5,861,826 | 1/1999 | Shu et al. | 341/120 |

*Primary Examiner*—Patrick Wamsley
*Attorney, Agent, or Firm*—Alan K. Stewart; Wade James Brady, III; Frederick J. Telecky, Jr.

[57] ABSTRACT

A trimming algorithm for a pipeline A/D converter includes the step of trimming the input sampling capacitor on each of the gain stages for each stage of the pipeline A/D converter. The input thereof is swept from a minimum to a maximum analog voltage and then the integral non-linearity (INL) of the A/D converter determined. The maximum transitions are then examined to determine which transitions are associated with which stage. The transitions for a given stage then constitute the gain error for these stages. The trim values are determined from this gain error and then the trim values incorporated into each of the gain stages.

7 Claims, 8 Drawing Sheets

TRIMMING ALGORITHM FOR PIPELINE A/D CONVERTER USING INTEGRATED NON-LINEARITY MEASUREMENT

CROSS-REFERENCE TO RELATED APPLICATIONS

This application claims priority under 35 USC § 119 (e) (1) of provisional application Ser. No. 60/067,236, filed Dec. 2, 1997.

This application is related to U.S. patent application Ser. No. 60/031,397, filed Nov. 19, 1996, and entitled "Method and Apparatus for Implementing a Pipeline A/D Converter with Interstage Amplifiers Having No Common-Mode Feedback Circuitry," (Atty. Docket No. TI-21951) and related to U.S. patent application Ser. No. 09/188,960, entitled "Trimming Circuitry for Pipeline A/D Converter" (Atty. Docket No. TI-24787).

TECHNICAL FIELD OF THE INVENTION

The present invention pertains in general to A/D converters and, more particularly, to trimming circuitry and the trimming algorithms associated therewith for trimming the amplifier stage in a pipeline A/D converter.

BACKGROUND OF THE INVENTION

Data conversion devices of the type utilizing analog-to-digital converters are utilized primarily for the purpose of quantizing analog signals for use in digital signal processing thereof. As the need for more powerful digital signal processing systems increases, the need for higher resolution ADCs increases. However, this increase in resolution also requires the ADCs to provide a much higher level of accuracy.

Most ADCs utilize switched capacitor elements and differential amplifiers. These switched capacitor elements, in order to obtain the necessary accuracy, must be accurately matched. Of course, this then requires the manufacturing process to achieve high levels of accuracy, which are sometimes difficult due to matching limitations between components, which components are fundamentally related to each other in an ADC algorithm by ratios therebetween. Since these limitations usually exceed the process capabilities, various calibration techniques are then implemented.

One type of ADC that has overcome some of the disadvantages noted above is the pipelined analog-to-digital converter. This type of ADC has some advantages over the flash or successive approximation techniques due to potentially high resolution and high speed that can be achieved at the same time. These converters use a plurality of converter stages, each converter stage involving a sub-ADC and a reconstructing digital-to-analog (DAC) converter. In addition, there is a gain element associated with each converter stage in the analog domain. The data conversion techniques utilize a plurality of switched capacitor elements, the output of which is an analog signal that is typically input to a differential interstage amplifier stage to provide the gain element. The implementation of the interstage amplifier utilizing a fully differential amplifier yields superior performance in power supply rejection. However, this is achieved with an interstage amplifier that utilizes common-mode feedback circuitry. This circuitry typically increases area, power and complexity, in addition to introducing parasitic capacitance, with a noted decrease in stability and speed.

In the design of accurate pipeline analog-to-digital converters, the gain of each stage is probably the most critical parameter. Other factors aside, the major contributor to gain error is capacitor mismatch. To account for mismatch, techniques have been developed to "trim" capacitors. This, of course, is difficult in that either capacitors must be added or subtracted from a circuit to place them in parallel order or remove them therefrom.

Any errors that exist in the gain of the amplifier portion of each stage of the pipeline A/D converter will cause non-linearities. There are two types of error factors associated with non-linearity, an integral non-linearity (INL) error and a differential non-linearity (DNL) error. The INL error represents a change of the transfer characters from the linear characteristics to a curve characteristic; that is, the transfer characteristic is not an ideal linear function. The DNL error, on the other hand, represents the irregularity of the adjacent output value. If the INL error becomes large, missing code can be generated in the A/D conversion operation.

SUMMARY OF THE INVENTION

The present invention disclosed and claimed herein comprises a method for trimming the pipelined gain stage in a pipeline analog-to-digital converter. A gain tuning element is provided for the gain stage that allows the gain thereof to be trimmed in accordance with an input trim value. The integrated non-linearity (INL) of the analog-to-digital converter is measured by sweeping the input thereof between two predetermined values such that a comparator transition in the gain stage occurs. The magnitude of the INL transition is then measured, this transition corresponding to the comparator transition. The magnitude of the INL transition has a predetermined relationship to the gain error of the gain stage. The gain error of the stage is then determined from the measured INL transition and the predetermined relationship. Thereafter, the gain of the gain stage is trimmed with the gain tuning element by generating the input trim value therefore corresponding to the determined gain error.

In another aspect of the present invention, the gain tuning element comprises a capacitive trimming network for trimming a sampling capacitor in the gain stage. This sampling capacitor defines the gain of the gain stage. The trimming network consists of a plurality of capacitors disposed in parallel with each other and across the sampling capacitor. Each of the capacitors has a switchable element associated therewith which can disconnect the capacitor from the parallel configuration or place it in a parallel configuration such that a discrete tuning operation is provided.

In a yet further aspect of the present invention, the step of sweeping the input between two predetermined values is operable to sweep over at least two adjacent comparator transitions in the gain stage. Each of the comparator transitions requires a predetermined number of output codes from the last transition such that each measured INL transition constitutes a predetermined number of discrete output codes.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
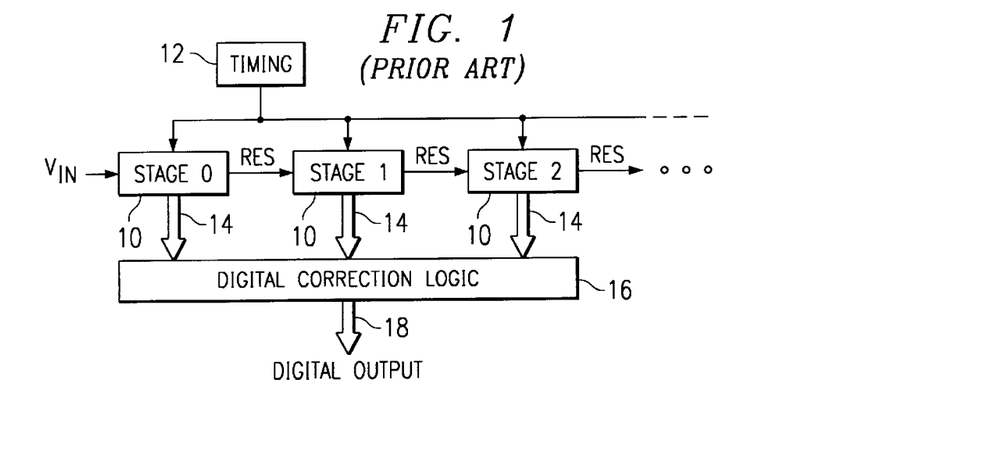
FIG. 1 illustrates a block diagram of a pipelined analog-to-digital converter.

Referring now to FIG. 1, there is illustrated a block diagram of a data conversion device utilizing a pipelined architecture. This pipelined architecture utilizes a plurality of multiply-by-two converter stages 10, arranged in a pipelined configuration, with the first of the stages 10 receiving an analog input voltage $V_{in}$ and outputting a residue analog signal. However, the gain could be a value different from two, but must be greater than one. The residue of each converter stage 10 after stage zero receives on the input thereof the residue analog signal from the previous converter stage 10. Each of the converter stages 10 receives timing signals from a timing block 12. Each of the converter stages 10 also outputs a 2-bit digital output, often referred to as a local output, on a 2-bit bus 14. Each of the buses 14 is input to a digital correction logic block 16 to provide a digital output on a bus 8, the digital output representing the conversion result of the data conversion device. The operation of the pipelined architecture is generally described in E. G. Soenen and R. L. Geiger, "An Architecture and An Algorithm for Fully Digital Correction of Monolithic Pipelined ADC's," IEEE Transactions On Circuits and Systems, vol. 42, No. 3, March 1995, pages 143–153, which article is incorporated herein by reference. Additionally, the operation of the pipelined ADC is also described in U.S. Pat. No. 5,499,027, issued to A. N. Karanicolas et al., on Mar. 12, 1996, which patent is incorporated herein by reference.

Figure 2:
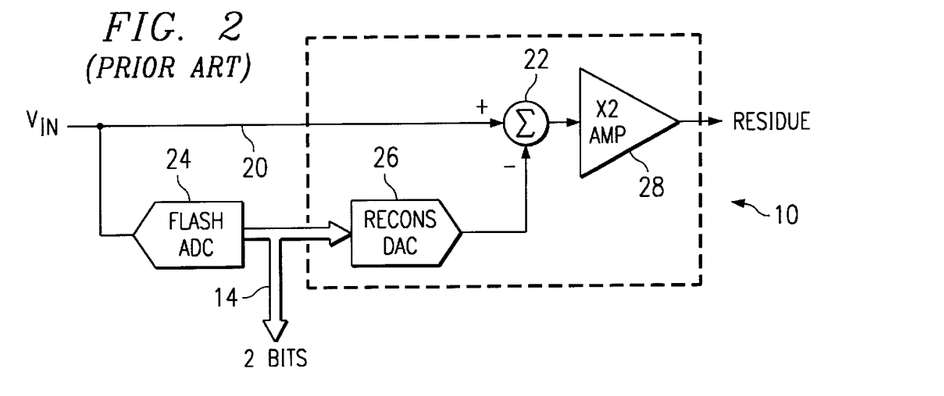
FIG. 2 illustrates a block diagram of one stage of the pipelined architecture.

Referring now to FIG. 2, there is illustrated a more detailed logic diagram of each of the converter stages 10. The input signal is received on a node 20, which node 20 is input to the positive input of a summing junction 22. The input voltage on node 20 is also input to the input of a flash ADC 24, the output thereof comprising the 2-bit output on the bus 14. This digital value then becomes an input to a reconstruction DAC 26, the digital output thereof comprising an input to the negative input of the summing junction 22. The summing junction output from summing junction 22 comprises the input to an interstage amplifier 28, the output of which comprises the residue signal. Although not illustrated as such, it should be understood that the input signal on node 20 is a differential voltage and the amplifier 28 is a differential amplifier.

In operation, the input signal is compared against a number of reference levels, $V_{ref}$, with the flash ADC 24 to provide a rough digital representation of the input voltage on the bus 14. This is sometimes referred to as a "thermometer format." This in general is referred to as the "local code" for the particular converter stage 10. This rough approximation is then converted to an analog value and subtracted from the analog input signal for that converter stage 10, and then multiplied by a factor of two by amplifier 28 before input to the next converter stage 10. The local codes in the present embodiment is a two bit value. The digital correction block 16 is operable to take the weighted sum of these local codes to generate the output in the following manner:

$$D_{OUT} = V_{DAC}^1 + \frac{V_{DAC}^2}{A_1} + \frac{V_{DAC}^3}{A_1 A_2} + \ldots$$

where: $A_1, A_2, \ldots$ is the gain of the successive stages $V_{DAC}$ is the output of the reconstructing DAC With the two bit local code, the digital correction block 16 will sum the adjacent bits of the local code of adjacent stages and provide a binary output therefore, with the LSB bit of the last stage being the LSB of the output and the MSB of the output being the sum of the MSB of the first stage and possible carry bits generated by the summation.

Figure 3:
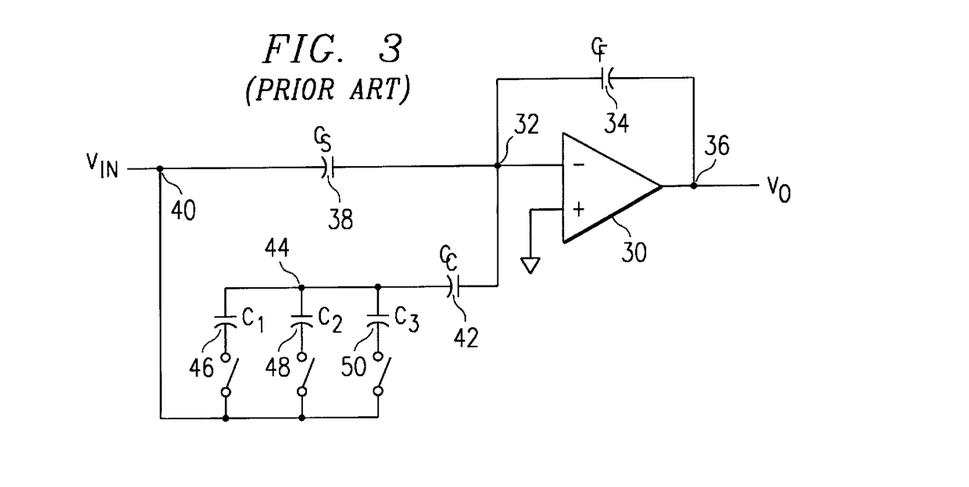
FIG. 3 illustrates a circuit diagram of a prior art amplifier stage with trimmed capacitors.

Referring now to FIG. 3, there is illustrated a schematic diagram of a prior art gain stage. An amplifier 30 is provided having a positive and a negative input, the positive input thereof connected to ground and the negative input thereof connected to the node 32. A feedback capacitor 34 is connected between the node 32 and an output node 36 of the amplifier 30. A sampling capacitor 38, labeled $C_S$, is connected between node 32 and an input node 40. A coupling capacitor 42 has one plate thereof connected to node 32 and one plate thereof connected to a node 44, coupling capacitor 42 labeled $C_c$. Between node 44 and node 40 there are connected three coupling capacitors 46, 48 and 50, labeled $C_1$, $C_2$ and $C_3$. The coupling capacitors 46–50 are each switchable with associated switches for selective connection between node 44 and node 40 such that the total sampling capacitance, $C'_S$, is as large as:

$$C'_S = C_S + (C_c \| (C_1 + C_2 + C_3)) \qquad (2)$$

The closed-loop gain of the stage is:

$$\text{Gain} = A = C'_S / C_f \qquad (3)$$

By turning on/off the switches associated with the capacitors 46–50, the gain A of the stage can be trimmed.

The purpose of utilizing the series connected coupling capacitor 42, $C_c$, is to reduce the "weight" of trimming capacitors $C_1$, $C_2$ and $C_3$, capacitors 46–50. Without the use of the coupling capacitor 42, the values of the trimming capacitors will be too small to be manufactured effectively. The disadvantage of the prior art circuit of FIG. 3 is that the input capacitance as seen by the previous stage at the node 40 is greatly increased due to the presence of the capacitors 46–50 and the parasitic capacitances of their switches. This increase of input capacitance could possibly load down prior stages and could eventually limit the speed performance of the overall converter.

Figure 4:
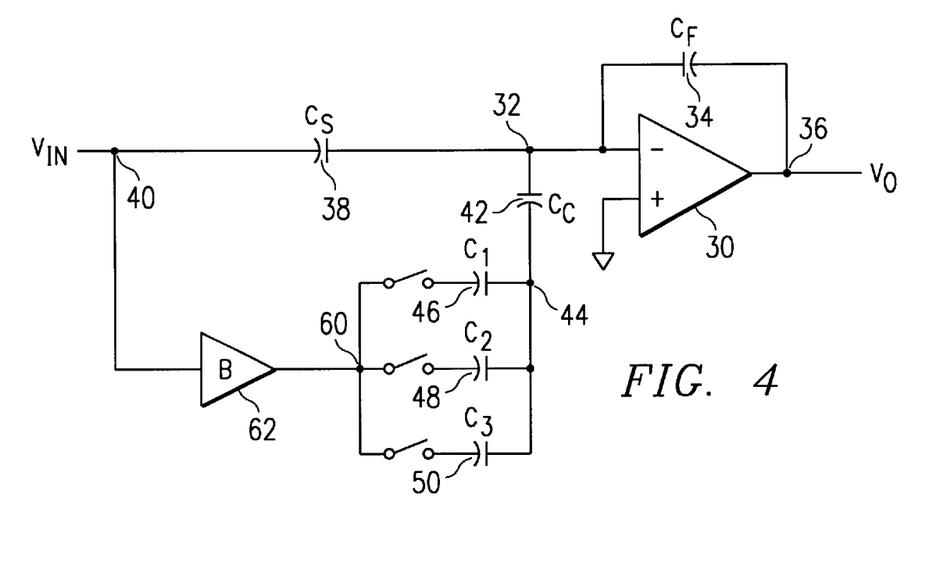
FIG. 4 illustrates a schematic diagram of the trimming method of the present invention.

Referring now to FIG. 4, there is illustrated an input stage operating in accordance with the present invention, wherein like numerals refer to like parts in the two figures. However, the capacitors 46–50 are connected between the node 44 and a node 60, rather than directly to node 40. A buffer circuit 62 is disposed between node 40 and node 60 to effectively isolate the capacitance of node 60 from node 40, i.e., the input impedance of the buffer 62 is all that is seen at node 40 by the prior stages.

Figure 5:
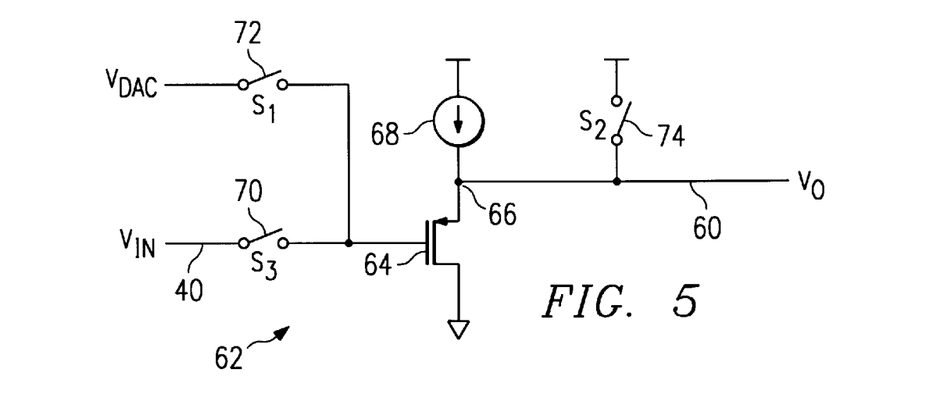
FIG. 5 illustrates a schematic diagram of the buffer circuit.

Referring now to FIG. 5, there is illustrated a schematic diagram of the buffer 62 and two external switches 70 and 72. A P-channel transistor 64 is provided having the source/drain path thereof connected to a node 66 and ground or $V_{ss}$. A current source 68 is connected between node 66 and the positive supply $V_{dd}$. The node 66 and the source of transistor 64 are connected to the output node 60, $V_o$, and also to one side of a precharge switch 74. Switch 74 has the other side thereof connected to $V_{dd}$. The buffer 62 is operated in a switched capacitor environment and, therefore, the input of the buffer 62 at the gate of transistor 64 will be connected to one side of the switch 70, and the other side thereof connected to the $V_{in}$ line 40. The gate of transistor 64 in the input of the buffer 62 is also connected to one side of the switch 72, the other side thereof connected to a DAC voltage $V_{DAC}$, which provides predetermined reference voltages for predetermined operations during the data conversion operation, as is conventional and as will be described in more detail hereinbelow.

Figure 6:
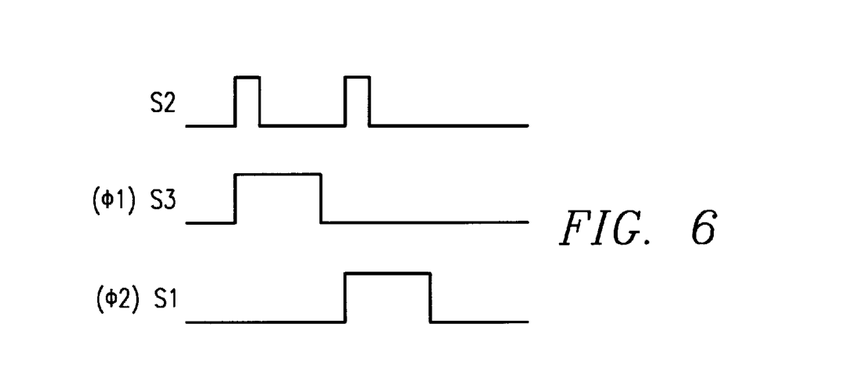
FIG. 6 illustrates the timing diagram for the operation of the switches in the buffer circuit of FIG. 5.

Referring now to FIG. 6, there is illustrated a timing operation for the switch 70, labeled $S_3$, the switch 72, labeled $S_1$, and the switch 74, labeled $S_2$. The timing signal $S_3$ and the timing signal $S_1$ are basically the clock signals utilized for a switched capacitor operation that are referred to as $\phi_1$ and $\phi_2$, as will be described hereinbelow. In general, the clock signals $S_1$ and $S_3$ are non-overlapping clock signals, with signal $S_3$ occurring first and signal $S_2$ occurring second. Signal $S_2$ is an overlapping signal with both $S_3$ and $S_1$, which occurs for a very short period of time proximate to the beginning of $S_3$ or the beginning of $S_1$, there being illustrated two pulses for the timing signal $S_2$. The timing signal $S_2$ constitutes a precharge signal, as will be described hereinbelow.

It can be seen that, when switch $S_3$ closes, transistor 64 will be turned on when $V_{in}$ is more than one threshold below the voltage on node 66 and the current to node 66 through current source 68 will be essentially constant, as long as transistor 64 is turned on. Since switch 74 is closed initially, transistor 64 will be turned on at the beginning of the cycle such that the lower plates of the selected ones of the capacitors 46–50 will be initially pulled high for a very short duration of time in a precharge operation. After the switch 74 is opened, the node 66 is pulled down to a voltage that is one $V_t$ above the input voltage on the node 40 thereby allowing the input signal $V_{in}$ to be sampled onto the lower plates of the capacitors 46–50. When switch 72 is closed at a later time than switch 70, with switch 70 open, the voltage $V_{DAC}$ will be placed onto the gate of transistor 64. During the initial portion of the timing sequence $S_1$, the timing signal $S_2$ is present for a short duration of time to precharge the node 62 to $V_{dd}$ and, subsequently, the other side of the plate of capacitors 46–50.

Since transistor 64 can sink a reasonable amount of current, there is little problem with pulling the output low, or discharging the trimming capacitors 46–50 to the voltage $V_{in}+V_T$ on the source of transistor 64. When charging the plate(s) of trimming capacitor(s) from the source of the transistor 64, the only current path is the current source 68. This is not desirable, since the current source 68 is not a sufficiently large current path for charging. Rather, the switch 74 is provided to perform a precharge operation on the lower plate of the trimming capacitor(s) 46–50, such that the output is always pulled low from the precharge level when sampling. However, it can be seen that there is a resultant offset $V_T$ in the system. In a fully differential configuration, as will be described hereinbelow, the offset $V_T$ in the above-noted source follower configuration of FIG. 5 will be balanced on both sides and therefore canceled. Therefore, the output node 60 will be at a voltage $V_{in}+V_T$.

Figure 7:
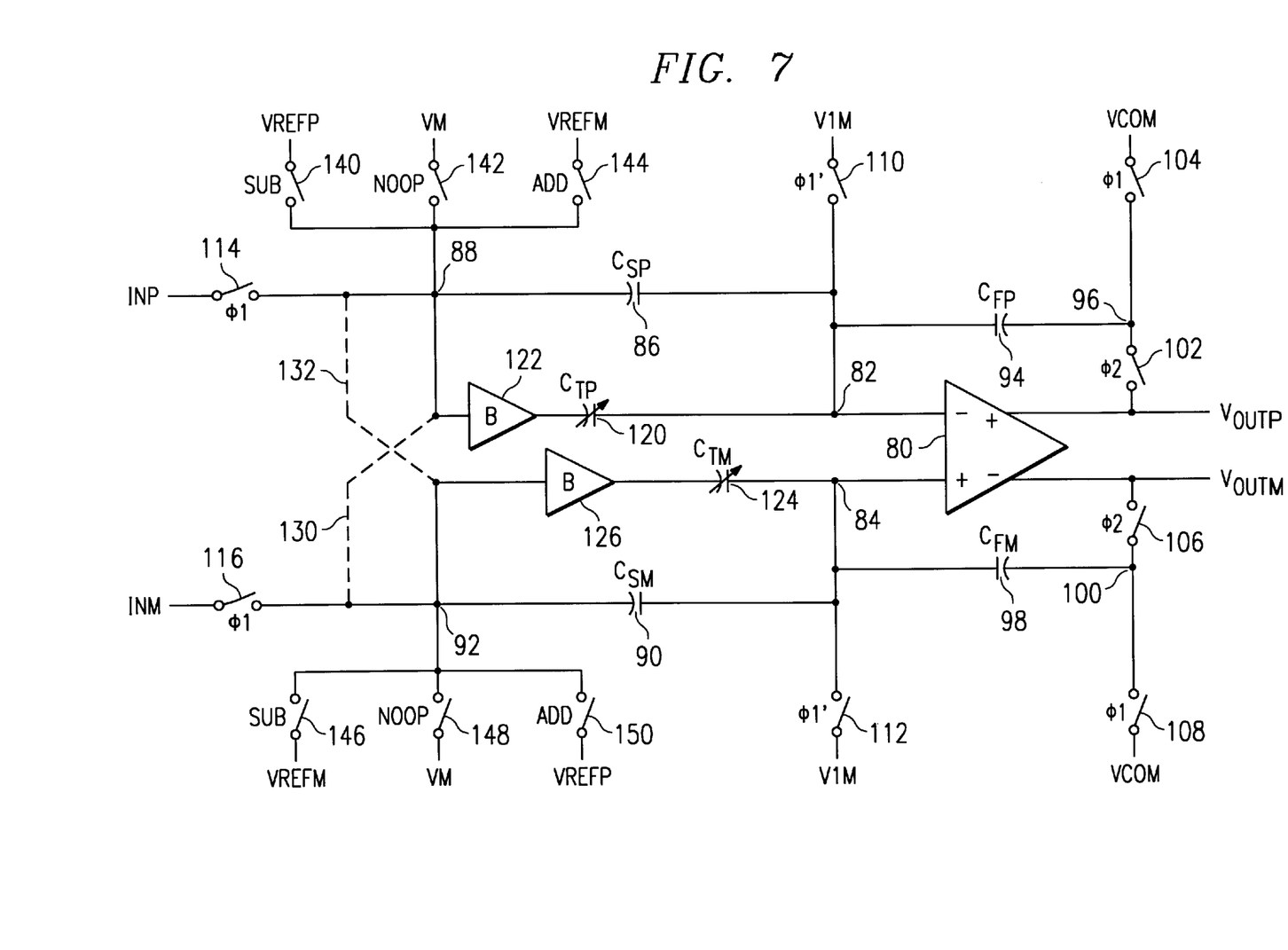
FIG. 7 illustrates a detailed schematic diagram of a differential amplifier operating in accordance with the present invention.

Referring now to FIG. 7, there is illustrated a fully differential schematic diagram of a gain stage utilizing the buffer 62. A differential amplifier 80 is provided having a positive and negative input and a positive and negative output. The negative input thereof is connected to a node 82 with the positive input thereof is connected to a node 84. A positive sampling capacitor 86, labeled $C_{sp}$, is connected between node 82 and a node 88. A negative sampling capacitor 90, labeled $C_{sm}$, is connected between node 84 and a node 92. A negative feedback capacitor 94, labeled $C_{FP}$, is connected between node 82 and a node 96. A negative feedback capacitor 98, labeled $C_{FM}$, is connected between node 84 and a node 100.

Since this is a switched capacitor configuration, a plurality of switches are required in accordance with conventional switched capacitor operation. The node 96 is connected to the positive output of the amplifier 82 with a switch 102 connected to the clock signal $\phi_2$. Node 96 is also connected to a common voltage $V_{com}$ with a switch 104 controlled by the clock signal $\phi_1$. Node 100 is connected to the negative output of amplifier 80 with a switch 106, clocked by the signal $\phi_2$. Node 100 is also connected to the common voltage $V_{com}$ with a switch 108, clocked by signal $\phi_1$. Node 82 is connected to a mid-level voltage $V_{1m}$ through a switch 110, clocked by signal $\phi_1'$. Node 84 is connected to the mid-level voltage $V_{1m}$ through a switch 112, clocked by signal $\phi_1'$. Node 88 is connected to the positive input through a switch 114, clocked by $\phi_1$, and the negative input thereof is connected to node 92 through a switch 116, clocked by $\phi_1$.

The trimming operation of the sampling capacitors 86 and 90 is facilitated with two trimmable capacitor networks. Capacitor 86 is trimmed with a trimming capacitor network 120, labeled $C_{tp}$, which is connected between node 82 and the output of a first buffer 122. Similarly, the sampling capacitor 90 is trimmed with a trimming capacitor network 124, labeled $C_{tm}$. The trimming network 124 is connected between node 84 and the output of a second buffer 126. The input of buffer 122 and the input of buffer 126 are connected in two configurations to effectively increase or decrease the value of the sampling capacitors 86 and 90. In the primary configuration illustrated in FIG. 7, the input of buffer 122 is connected to node 88, and the input of buffer 126 is connected to node 92. This will effectively increase the capacitance value of the sampling capacitors 86 and 90. However, in the alternate configuration, the input of buffer 122 can be connected to node 92, as indicated by phantom line 130, and the input of buffer 126 can be connected to node 88, as indicated by a phantom line 132, to effectively decrease the capacitance value of the sampling capacitors 86 and 90. However, it should be noted that when the phantom lines 130 and 132 are utilized for the input connections, then buffer 122 is not connected on the input thereof to node 88, and buffer 126 is not connected on the input node thereof to node 92.

In the switched capacitor operation, the node 88 and the node 92 are connected to a different reference voltage levels, depending upon various operations. There are three operations: a subtract operation SUB, and addition operation ADD and a no-operation NOOP. In association with node 88, there are provided three switches 140, 142 and 144, each having one side thereof connected to node 88. The other side of switch 140 is connected to a reference voltage $V_{refp}$, a positive reference voltage, the switch 142 has the other side thereof connected to a mid-level voltage $V_m$, and the other side of switch 144 is connected to a reference voltage $V_{refm}$. The subtract operation is associated with switch 140, the addition operation is associated with the switch 144, and the no-operation is associated with switch 142. In a similar manner, there are provided three switches 146, 148 and 150 having one side thereof connected to node 92. The other side of switch 146 is connected to a negative reference voltage $V_{refm}$ and is controlled by the SUB operation. The switch 148 has the other side thereof connected to the mid-level voltage $V_m$ and is controlled by the NOOP operation. The other side of switch 150 is connected to the positive reference voltage $V_{refp}$ and is controlled by the ADD operation. The operation of the switches 146–150 will not be described herein, as they are associated with the normal switched capacitor operation.

Figure 8:
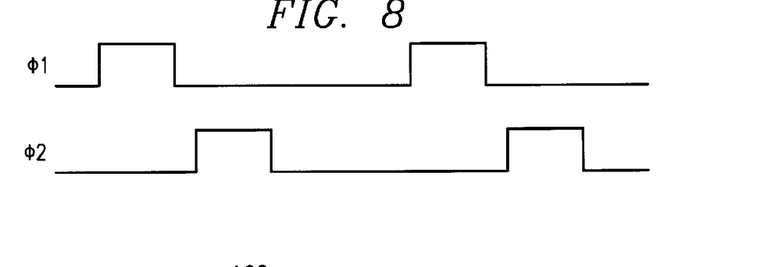
FIG. 8 illustrates a timing diagram for the switched capacitor operation.

Referring now to FIG. 8, there is illustrated the timing diagram for the clocks $\phi_1$ and $\phi_2$, this being a conventional operation.

Figure 9:
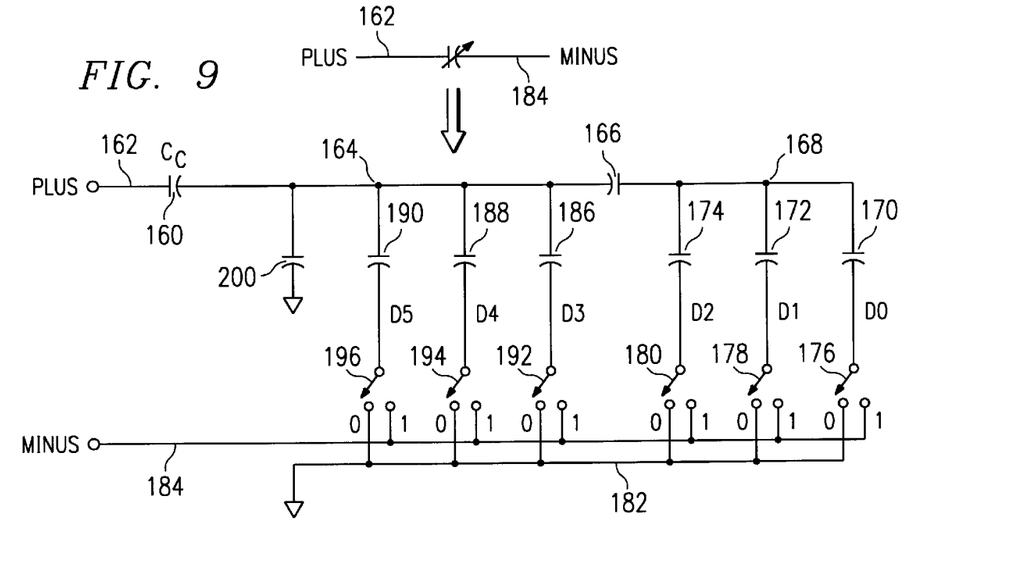
FIG. 9 illustrates a detailed schematic diagram of the trimmable capacitor network.

Referring now to FIG. 9, there is illustrated a circuit diagram for each of the trimming capacitor networks 120 and 124. The trimming networks 120 and 124 have associated therewith a coupling capacitor 160, which is connected between a positive node 162 and a node 164. Node 164 is connected to one side of a second coupling capacitor 166, the other side thereof connected to a node 168. Node 168 has three capacitors associated therewith, a capacitor 170, a capacitor 172 and a capacitor 174, each labeled D0, D1 and D2, respectively. Each of the capacitors 170–174 has one side thereof connected to node 168 and the other side thereof connected to one of respective switches 176, 178 and 180. Switches 176–180 have two positions, a first position associated with logic "0" which is connected to a ground node 182, and a second position for a logic "1" that is connected to a node 184, the node 184 comprising the negative plate of the trimming network. The logic "0" and the logic "1" are merely logic levels of a logic input device that controls the switches 176 and 180, this not being shown herein. However, it should be understood that these could be connected in a mask level configuration, they could be the result of a fusable link, or any other equivalent structure. It is merely an important aspect that the negative terminal of the capacitors 170–174 can be connected to one of the two positions.

The node 164 also has three capacitors associated therewith, a capacitor 186, a capacitor 188 and a capacitor 190, each of the capacitors 186–190 labeled D3, D4 and D5, respectively. Capacitors 186–190 each has the positive side thereof connected to node 164 and the negative side thereof connected to one of respective switches 192, 194 and 196. Switches 192–196 are connected to either the node 192 or the node 184, depending upon the respective logic state, logic "0" or logic "1," associated therewith. In addition to the capacitors 186–190, there is also a capacitor 200 connected between node 164 and ground. In the preferred embodiment, the capacitors 170, 172 and 174 have values of 40.5 fF, 81 fF and 162 fF, respectively. The capacitors D3, D4 and D5 have the values of 40.5 fF, 81 fF and 162 fF. The capacitor 166 has a value of 40.5 fF, and the capacitor 160 has a value of 8 fF. Capacitor 200 has a value of 338 fF.

Figure 10:
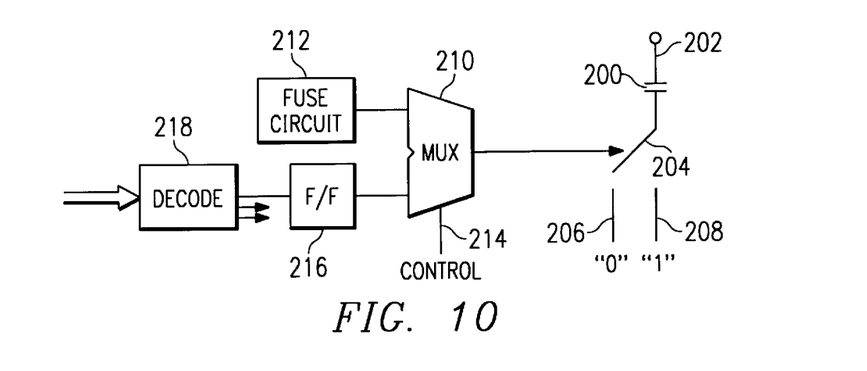
FIG. 10 illustrates a block diagram of a switch control circuit for setting the value of the trimming switch associated with each of the trimming capacitors.

Referring now to FIG. 10, there is illustrated a block diagram of circuitry for setting the state of the switch associated with each of the trimmable capacitors, there being illustrated a trim capacitor 200 having a first plate tied to a node 202 and the other plate thereof connected to one side of a switch 204. The switch 204 is connected to either a terminal 206 or a terminal 208, terminal 206 associated with the logic "0" state, and terminal 208 associated with the logic "1" state. The switch is controlled by the output of the multiplexer circuit 210, which is operable to select one of two inputs. The first input is received from a fuse circuit 212. The fuse circuit 212 is the circuit that is selected in the normal operating mode. A control signal on a line 214 to the multiplexer 210 selects one of two inputs. The fuse circuit 212 essentially outputs a logic "1" or a logic "0" state. The state is set by programming the fuse circuit 212 with an external voltage. Therefore, this is a programmable fuse circuit. However, it should be understood that this fuse circuit 212 could be implemented with a fusable link that is scribed by a laser or some other interruptible element.

The other input of the multiplexer is connected to the output of a flip-flop 216, which flip-flop has a state thereof determined by the code circuit 218. The code circuit 218 provides the code outputs for each of the bits for each stage of the trimmable capacitor networks. As described hereinabove with respect to FIG. 9, there are six trimmable capacitors with control bits D0–D5. In operation, this provides the user with the ability to, during a test mode, place the switch 204 in one of its two positions and then test the circuit to determine if the values are correct. Once the correct values are obtained, they can be programmed into the chip with the fuse circuit 212 associated with each of the switches 204.

Figure 11:
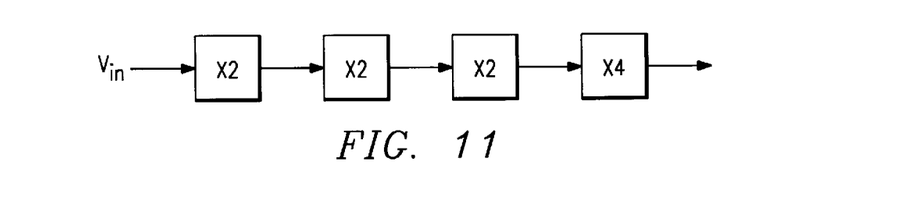
FIG. 11 illustrates a block diagram of the sequence of gain stages in the pipeline A/D converter.

Referring now to FIG. 11, there is illustrated a block diagram of the gain sequence of the first four stages for a typical 12-bit pipeline A/D converter. It is noted that the first four stages are comprised of three input stages having a 2× gain and a fourth stage having a 4× gain. This gain configuration will be utilized hereinbelow as an example.

Figure 12:
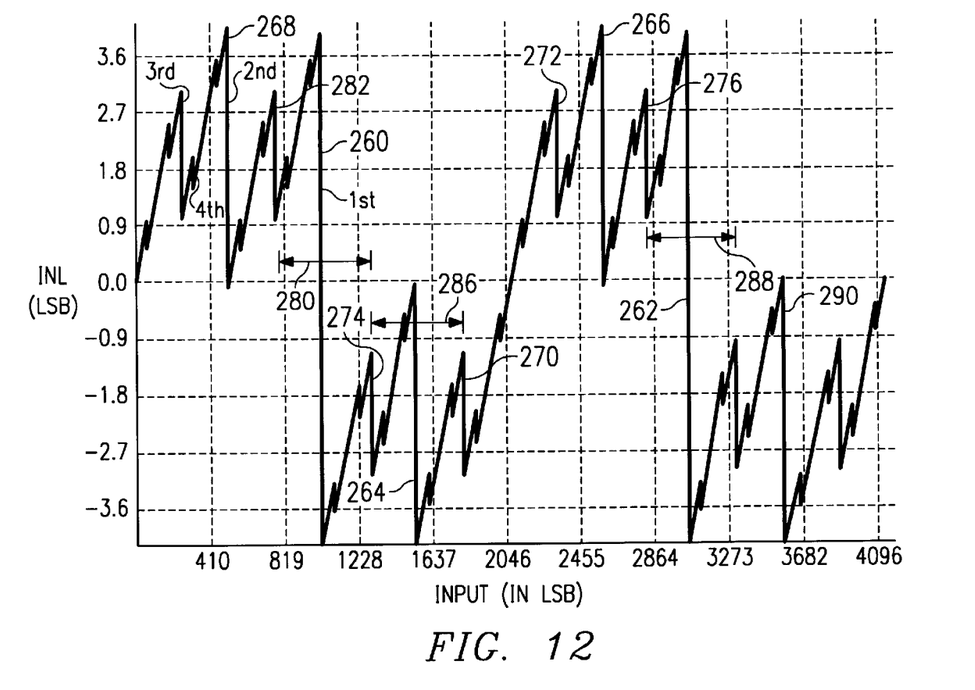
FIG. 12 illustrates a waveform for the INL of the A/D converter as the input is swept.

Referring now to FIG. 12, there is illustrated a plot of INL versus input voltage as the input of the A/D converter of FIG. 11 is swept from a minimum analog reference voltage to a maximum analog reference voltage. In the example of FIG. 12, the ADC has a gain error in each stage of –0.4%. Of course, it should be understood that the gain error can vary for each stage and is not necessarily the same. Again, this gain error is due to various circuit mismatches and the such. Since the gain of the amplifier is the ratio of the sampling capacitor to the feedback capacitor, trimming of either one of these capacitors will increase or decrease the gain. It is important that the gain be exactly 2× to ensure linearity for a given stage. If there is an error in the gain, this will be expressed as an increased INL.

Referring further to FIG. 12, it can be seen that there are a number of large and small steps or transitions. The large steps, or the sudden transitions, are the result of one of the stages passing its comparator threshold. Since the gain error in the first stage will be "exacerbated" by the gain of the second stage, the gain of the third stage, and the gain of the fourth stage, it can be seen that the gain error of the first stage will be weighted greater than that of the second stage, the gain error of the second stage weighted greater than that of the third stage, and so on. As such, the largest transition will be associated with the first stage if the intrinsic gain error of each stage is comparable.

In the plot of FIG. 12, there are illustrated two large transitions 260 and 262. The second stage will result in a smaller step by a factor of two. The next smaller transition is illustrated by a negative transition 264, a negative transition 266 and a negative transition 268 and a negative transition 290. However, only the transitions between transitions 260 and 262 will be examined, as all of the transitions are repetitive. For the third stage, the step will be one-eighth (⅛) the step associated with the first stage, i.e., transitions 260 and 262. This is represented by transitions 270 and 272. It should be noted that there are two peaks associated with the negative transitions of the second stage at transitions 264 and 266 between the transitions 260 and 262. There are four transitions associated with the third stage equal in magnitude to transitions 270 and 272. For example, there is an additional transition 274 that occurs before transition 270 but after transition 260, and an additional transition 276 that occurs after transition 272 but before transition 262. Each of the transitions 270, 272, 274 and 276 are the same magnitude. In general, each of the transitions 260–276 represents the maximum gain error which occurs at the point where the threshold of the comparator for each of the stages is crossed. Therefore, this provides a measurement of gain error. The only thing necessary is to discriminate between stages for the given transitions. As noted herein, that is achieved by recognizing that the largest transition is associated with the first stage, the next largest with the second stage, and so on.

To effectively analyze the INL curve, it is necessary to define non-overlapping windows. For the transition 260, there is illustrated a window 280, which window 280 is defined between a transition 282 and the transition 274. The transition 282 is the transition associated with the third stage and is identical in magnitude to the transition 274. For the second stage, there is defined a window 286 between the transitions 274 and 270 which contains the transition 264. In addition, there will be a non-overlapping window 288 which is identical to the non-overlapping window 280, and this bounds the transition 262. Once the non-overlapping window is defined, it is only necessary to make a move from one transition to the next, which transitions occur at the peaks of the curve. Note that these non-overlapping windows are only associated with the first, second and third stages, which each has a gain of two. The fourth stage, with a gain of four, will result in transitions that occur significantly more often, i.e., sixteen times as often as the transitions for the first stage.

Figure 13:
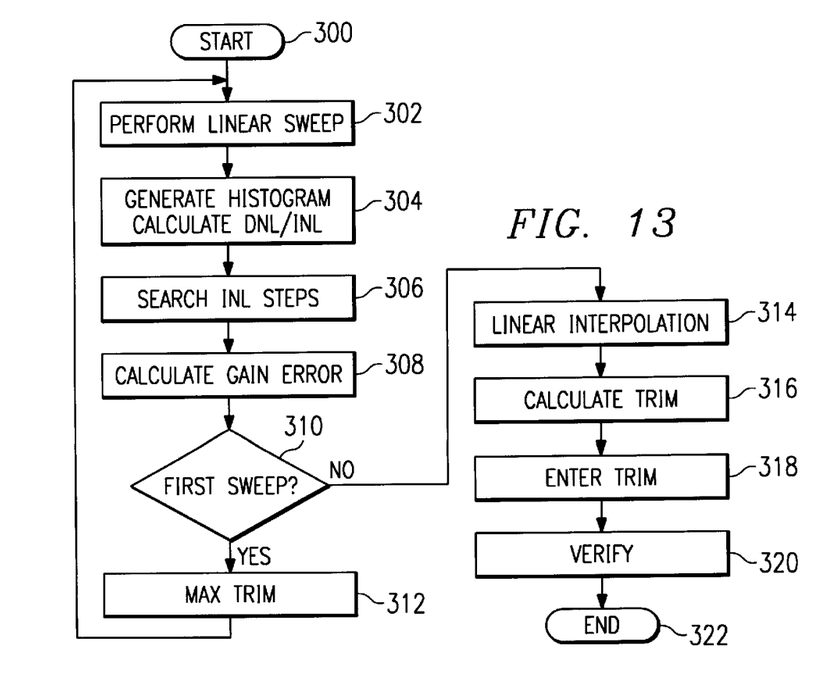
FIG. 13 illustrates a flow chart for the trimming algorithm utilized to trim the gain of each stage.

Referring now to FIG. 13, there is illustrated a flow chart depicting the steps of the trimming algorithm. The program is initiated at a Start block 300 and then proceeds to a function block 302 wherein a linear sweep of the A/D converter is performed from a minimum reference voltage level to the maximum voltage reference level. The sweep is done over a predetermined time period. For a 12-bit A/D converter, this will result in 4096 output codes. This sweep was depicted hereinabove with reference to FIG. 12. Once the linear sweep is performed, the program will then flow to a function block 304 wherein a histogram is generated, and then the DNL and INL are calculated. The INL, as noted hereinabove, is the integration of the DNL. Again, this is a conventional operation.

Once the INL is generated, the program will flow to a function block 306 wherein a search operation will be performed on the INL curve. This search, as noted hereinabove, is performed by defining maximum non-overlapping windows, and then determining where the largest transitions exist to define the gain error of the first stage, where the second largest transitions exist to define the gain error of the second stage, and where the third largest transitions exist to define the gain error of the third stage. In general, the width of window is a known factor, and it is therefore only necessary to determine where the transition is. Once one of the transitions is found, then the remaining transitions can be located and the magnitude of all of the transitions can be measured in terms of the number of least significant bits (LSB) of range for that transition. The program will then flow to a function block 308 to calculate the gain error.

The gain error is calculated for each stage by measuring each transition and then dividing the magnitude of that transition by the number of output codes associated with that transition. For example, the first stage will have two transitions associate therewith for each sweep, with each transition therefore having 4096/2, or 2048, output codes associated therewith. With reference to FIG. 12, it would only be necessary to measure the transition 260 for the first stage to determine the gain error for the first stage, and then divide this transition level by the total number of codes associated therewith, 2048. However, to average the gain error over the entire sweep, transitions 260 and 262 are added together, divided by 4096, and then the total divided by two. For the second stage, the third and fourth largest steps, i.e., transitions 266 and 268, are summed together, divided by 2048, and then divided by two again. The reason for this is that there are actually four transitions in the entire sweep which, when divided by two, requires only the addition of two steps and then divide the sum by 2048 instead of 4096, since the sum constitutes only two of the total four transitions, and then this multiplied by two to account for the gain of the first stage. This sum is then again divided by two to determine the magnitude for a single transition averaged over two transitions. With respect to the third stage, the fifth and sixth largest transitions are added together, divided by 1024, and then multiplied by four to account for the gain of the first and second stages. This is then divided by two to come up with the error for a single step. Again, it is noted that the basic equation is to determine how many codes are associated with each transition, and then divide the magnitude of that transition by the number of codes required to generate that transition in order to determine the absolute level. The equations for determining the trim value for each stage are defined as follows:

$$MSB1_{TRIM} = (\text{SUM of } 1^{st} \text{ and } 2^{nd} \text{ largest steps}/4096)$$

$$MSB2_{TRIM} = (\text{SUM of } 3^{rd} \text{ and } 4^{th} \text{ largest steps}/2048) \times 2$$

$$MSB3_{TRIM} = (\text{SUM of } 5^{th} \text{ and } 6^{th} \text{ largest steps}/1024) \times 4$$

Each of these values $MSB1_{TRIM}$, $MSB2_{TRIM}$ and $MSB3_{TRIM}$ are each then divided by a factor of two to determine the absolute number for the trim value.

Referring further to FIG. 13, after the gain error is calculated in function block 308, the program flows to decision block 310 to determine if this is the first sweep operation. If so, the program will flow to function block 312 along a "Y" path to set the maximum trim, either positive or negative. The positive or negative value is determined in function block 306. Once the maximum trim value is set, the program will flow back to the input of function block 302 to perform another gain error calculation. Once the second gain error calculation has been performed at the maximum trim value, the program will flow along an "N" path from decision block 310 to a function block 314 to perform a linear interpolation, as will be described hereinbelow. Once the linear interpolation has been performed, the program will flow to a function block 316 to calculate the trim for a zero gain error. The program will then flow to a function block 318 to enter this trim value, and then to a function block 320 to verify the value. The verification operation in function block 320 basically requires performing the operations described hereinabove with reference to function blocks 302 and 304. Once verified, the program will flow to an End block 322.

Figure 14:
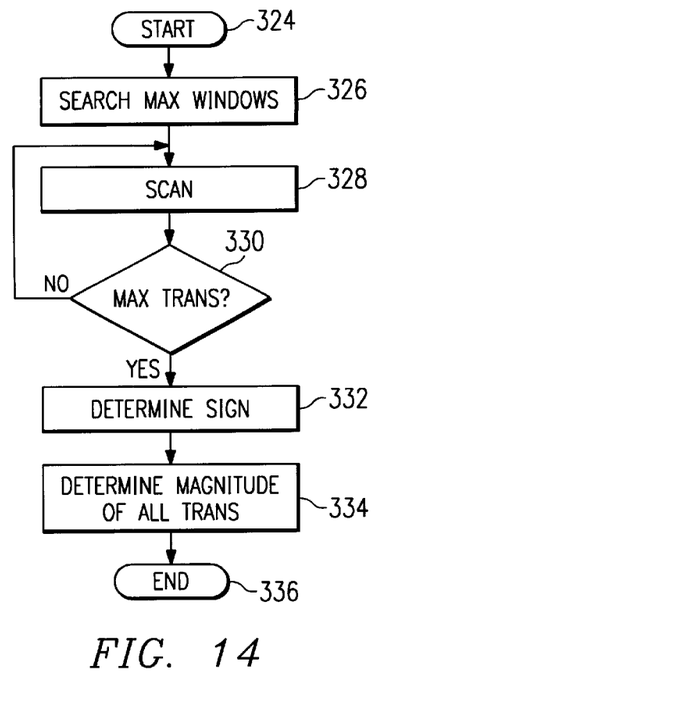
FIG. 14 illustrates a flow chart depicting the search operation for searching the INL plot for transitions.

Referring now to FIG. 14, there is illustrated a flow chart depicting the searching operation for the INL transitions, as noted hereinabove with respect to function block 306 in FIG. 13. The program is initiated at a Start block 324 and then proceeds to a function block 326 wherein the maximum non-overlapping windows are searched. These are noted hereinabove with reference to FIG. 12 and windows 280, 286 and 288. The program will then flow to a function block 328 wherein the INL curve is scanned after generation thereof and then to a decision block 330 to determine if the maximum transitions have been determined, these being for the first stage, second stage and the third stage. If not, the program will flow along an "N" path back to the input of function block 328 until the transitions have been determined. Once all transitions have been determined, the program will flow to a function block 332 to determine the sign of the gain error for each stage. As noted hereinabove, it is possible to have some stages with positive gain errors and some stages with negative gain errors. Once the sign of the gain error has been determined, the program will flow to a function block 334 to determine the magnitude of all transitions and then to an End block 336.

Figure 15:
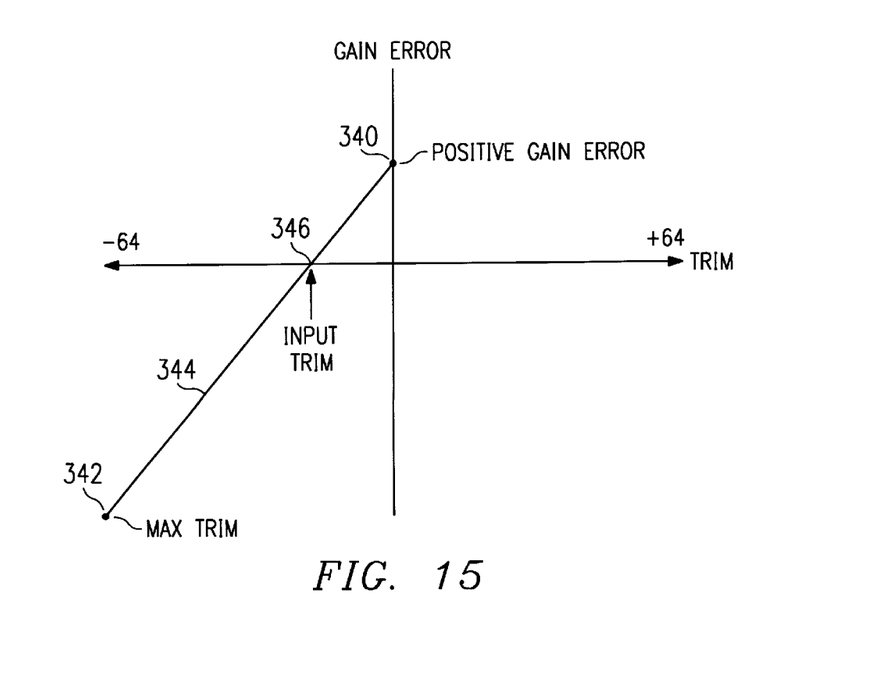
FIG. 15 illustrates a plot of gain error versus trim value.

Referring now to FIG. 15, there is illustrated a diagrammatic view of the interpolation operation. The trimming operation in the disclosed embodiment involves 128 steps. The trimming network is set such that the trim capacitors are selected in mid-trim; that is, the value can be increased by 64 increments or decreased by 64 increments. This is indicated on an x-axis labeled "TRIM." the y-axis being the gain error. In the initial pass through the algorithm described with reference to the flow chart of FIG. 13, the error at mid-trim is determined as a point 340 on the y-axis with the value of the x-axis set to the mid-trim level. In the second pass-through, the maximum trim value is set and then the gain error measured. This will be a maximum trim of −64 for the trim input. This will result in a point 342 in the third quadrant. When a straight line 344 is drawn between points 340 and 342, it will intersect with the x-axis at a point 346. Point 346 is the input trim value that will yield a zero gain error. It should be noted that for this procedure to be successfully performed, it is important to know whether it is a positive or negative gain error. If it were a negative gain error, then the trim will be set to the maximum positive trim level of +64. However, with a positive gain error, this shows that a negative trim needs to be added to the system as noted at point 346. Once this trim value is noted, it can then be input to the system and the trim value input through the filse operation noted hereinabove.

Figure 16:
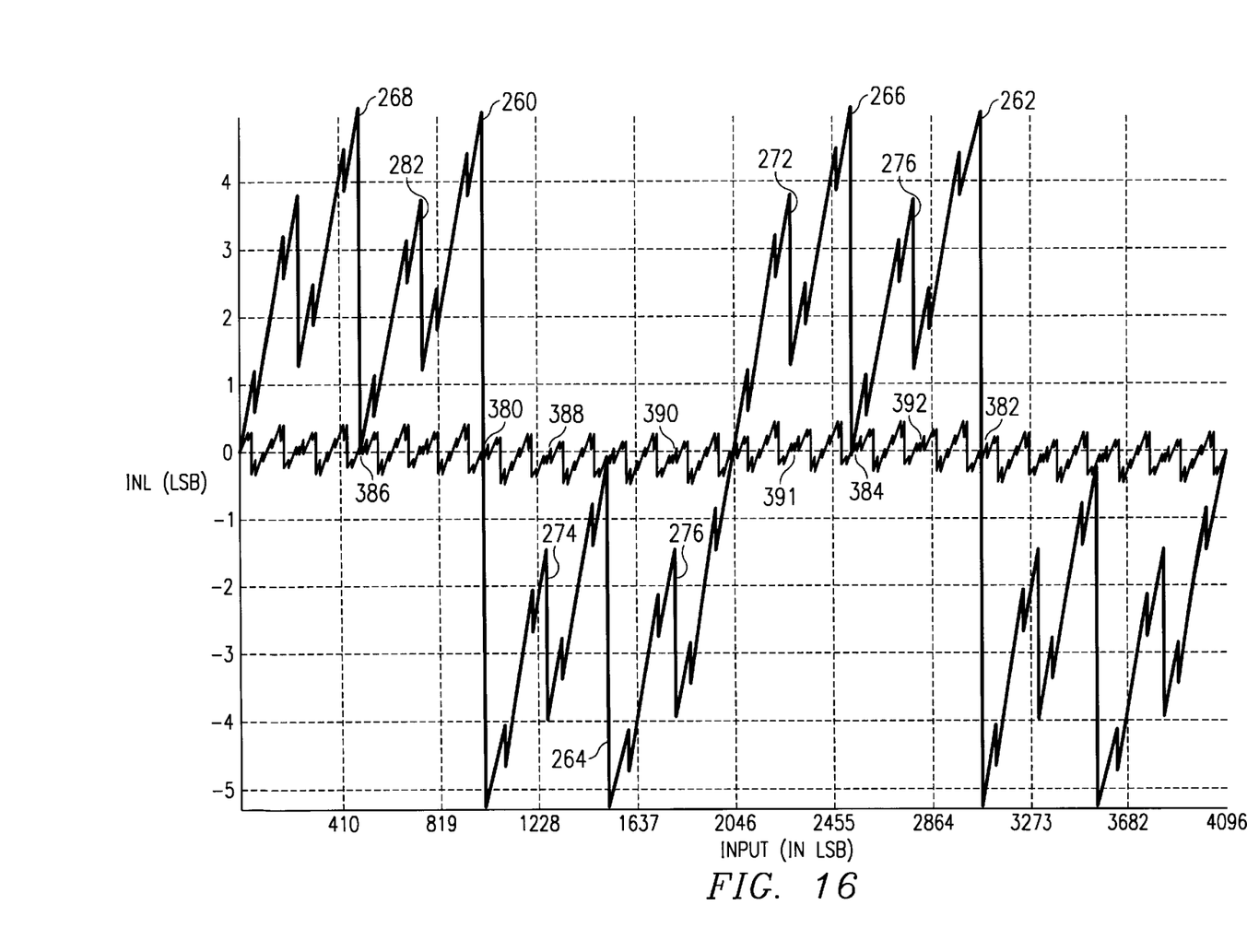
FIG. 16 illustrates a waveform depicting the INL of a pipeline A/D converter with −0.4% gain errors before and after trimming.

Referring now to FIG. 16, there is illustrated a plot of the INL both before and after trim. The INL before trim is substantially identical to that noted above with respect to FIG. 12 in that the gain error is −0.4% for each stage prior to trimming. Like numerals refer to like parts in the two FIGS. 12 and 16. It can be seen that the transition 260 which extends from approximately −5.2 LSB to +5 LSB will now be at 0 LSB at a point 380. The transition 262 will now be reduced to a LSB gain error at a point 382. Similarly, transition 266 will be reduced to a LSB gain error at a point 384, and transition 268 will be reduced to a LSB gain error at a point 386. Transition 274 will be reduced to a LSB gain error at a point 388, transition 276 will be reduced to a LSB gain error at point 390, transition 272 will be reduced to a LSB gain error at a point 391, and transition 276 will be reduced to a LSB gain error at a point 392. In effect, by utilizing the trimming algorithm disclosed herein, the INL has been reduced to ±0.3 LSB. Prior to trimming, it ranged from −5.2 to +5.2LSB.

Figure 17:
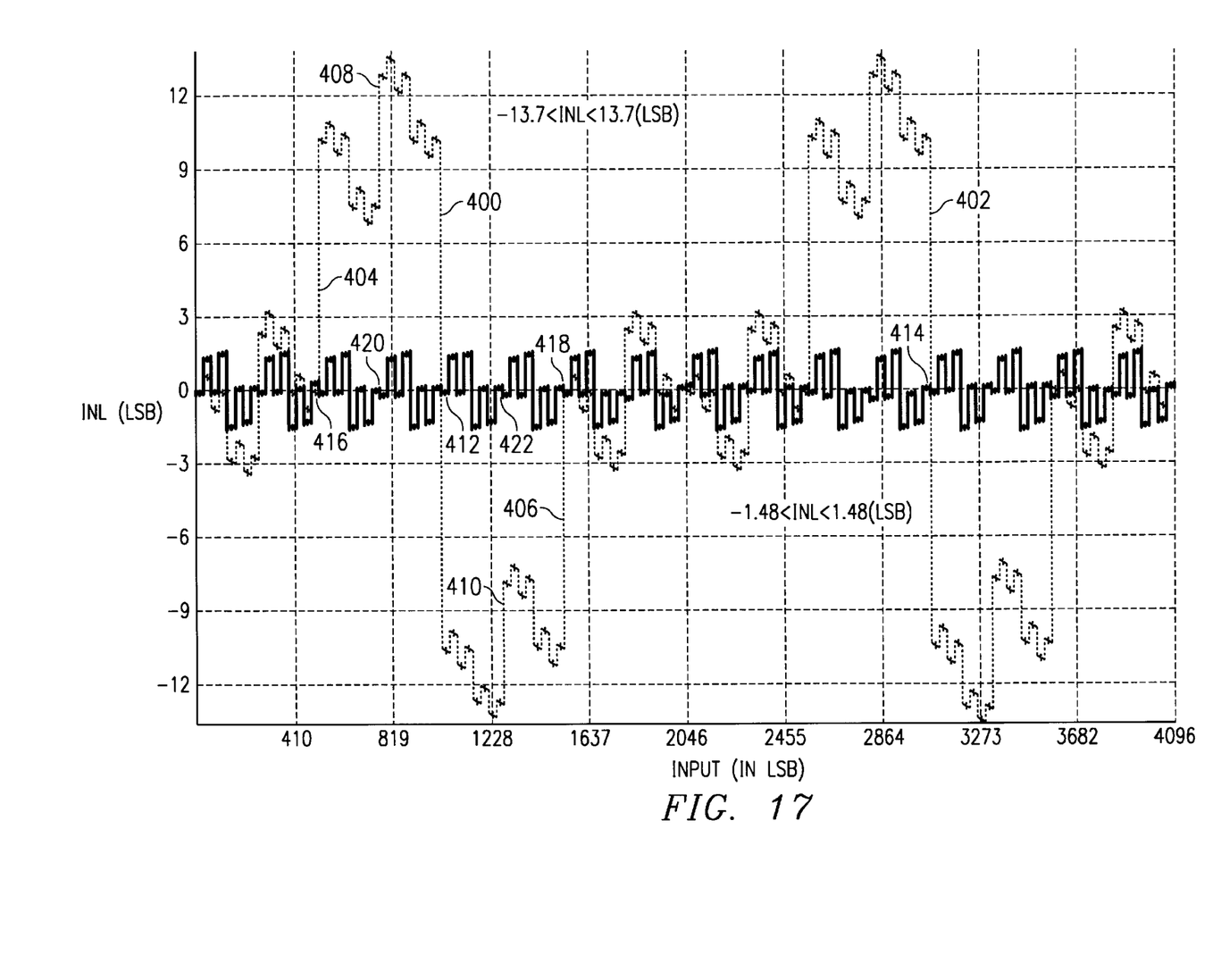
FIG. 17 illustrates an INL waveform for a gain error of ±1.0% error in a pipeline A/D converter both before and after trimming.

Referring now to FIG. 17, there is illustrated a second INL plot, both before and after trimming, for an initial gain error that ranges between +1% and −1%. In the untrimmed INL, there are illustrated two primary large transitions 400 and 402 for the first stage. The second stage has two transitions 404 and 406. The third stage has two transitions 408 and 410. After trimming, the primary transitions 400 and 402 are reduced to a LSB gain error at points 412 and 414, respectively. Transitions 404 and 406 are reduced to LSB transitions at points 416 and 418, respectively. Transitions 408 and 410 are reduced to LSB transitions at points 420 and 422, respectively.

In summary, there has been provided an algorithm for trimming the gain stages of a pipeline A/D converter. Each of the gain stages includes an input sampling capacitor and a feedback capacitor, the ratio of which defines the gain. A capacitive trimming network is provided that can be connected across the input sampling capacitor for changing the value thereof. The trimming network has a plurality of discrete settings which can be selected. The trimming algorithm initially sets the trimming network to mid-range and then determines the INL of the pipeline A/D converter as the input voltage is swept from minimum to maximum. The INL is examined to determine transitions associated with each of the stages, the largest transitions associated with the first stage, the next largest associated with the second stage, and the third largest associated with the third stage. The magnitude of each of these transitions is measured and then divided by the number of codes associated with those transitions. This defines the gain error per step. This gain error is then trimmed out with the trimming network.

Although the preferred embodiment has been described in detail, it should be understood that various changes, substitutions and alterations can be made therein without departing from the spirit and scope of the invention as defined by the appended claims.

What is claimed is:

1. A method for trimming a pipelined gain stage in a pipeline analog-to-digital converter, comprising the steps of:

providing a gain tuning element for the gain stage to allow the gain thereof to be trimmed in accordance with an input trim value;

measuring the integrated non-linearity (INL) of the analog-to-digital converter by sweeping the input thereof between two predetermined values such that at least one comparator transition in the gain stage occurs;

measuring the magnitude of the at least one INL transition in the measured INL, which transition corresponds to the comparator transition, and which magnitude has a predetermined relationship to the gain error of the gain stage;

determining the gain error of the gain stage from both the measured INL transition and the predetermined relationship between the magnitude of the measured INL transition and the associated gain error; and trimming the gain of the gain stage with the gain tuning element by generating the input trim value therefor corresponding to the determined gain error.

2. The method of claim 1 wherein the gain stage is a sampled gain stage having an input sampling capacitor, and wherein the step of providing the gain tuning element comprises providing a capacitive trimming network for trimming the input sampling capacitor, which input sampling capacitor defines the gain of the gain stage.

3. The method of claim 2 wherein the capacitive trimming network comprises a plurality of trim capacitors each having one plate thereof connected to a common node, and the other plates thereof connected to associated switchable elements which can each be switched to a second node, which first and second nodes are disposed across the input sampling capacitor, and each of the switchable elements selectively activatable to select one or more of the trim capacitors for being disposed in parallel with the input sampling capacitor.

4. The method of claim 1 wherein the step of measuring the INL of the analog-to-digital converter comprises sweeping the input thereof between two predetermined analog values such that at least two adjacent comparator transitions in the gain stage occur with only one of the comparator transitions corresponding to the measured INL transition.

5. The method of claim 4 wherein the output of the analog-to-digital converter is a digital output comprised of a plurality of digital codes associated with different values of the analog input voltage, and wherein the gain error is determined by the measured magnitude of the corresponding INL transition divided by the number of output codes between the two adjacent comparator transitions.

6. The method of claim 4 wherein the step of measuring the INL of the analog-to-digital converter comprises sweeping the input between a minimum input voltage and a maximum input voltage.

7. A method for trimming the pipelined gain stages in a multi stage pipeline analog-to-digital converter, comprising the steps of:

providing a gain tuning element for each of the gain stages to allow the gain thereof to be trimmed in accordance with an associated input trim value;

measuring the integrated non-linearity (INL) of the analog-to-digital converter by sweeping the input thereof between two predetermined values such that at least one comparator transition in each of the gain stages occurs;

discriminating the INL transitions for each of the gain stages;

measuring the magnitude of the discriminated INL transition for each of the gain stages in the measured INL, which transition corresponds to the comparator transition in the associated gain stage, and which magnitude has a predetermined relationship to the gain error of the associated gain stage;

determining the gain error of each of the gain stages from both the measured INL transition and the predetermined relationship between the magnitude of the measured INL transition and the associated gain error; and trimming the gain of each of the gain stages with the gain tuning element by generating the input trim value therefor corresponding to the determined gain error.

* * * * *